(12) United States Patent  
Baek et al.

(10) Patent No.: US 12,165,933 B2
(45) Date of Patent: Dec. 10, 2024

(54) SEMICONDUCTOR SUBSTRATE PROCESSING APPARATUS AND SEMICONDUCTOR SUBSTRATE MEASURING APPARATUS USING THE SAME

(71) Applicant: SAMSUNG ELECTRONICS CO., LTD., Suwon-si (KR)

(72) Inventors: Inkeun Baek, Suwon-si (KR); Namil Koo, Hwaseong-si (KR); Suhwan Park, Incheon (KR); Junbum Park, Goyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 892 days.

(21) Appl. No.: 17/180,343

(22) Filed: Feb. 19, 2021

(65) Prior Publication Data

US 2022/0037215 A1 Feb. 3, 2022

(30) Foreign Application Priority Data

Jul. 31, 2020 (KR) .................. 10-2020-0095798

(51) Int. Cl.
*H01L 21/66* (2006.01)
*G01N 21/95* (2006.01)
(Continued)

(52) U.S. Cl.
CPC .......... *H01L 22/24* (2013.01); *G01N 21/9501* (2013.01); *G01N 21/9505* (2013.01);
(Continued)

(58) Field of Classification Search
CPC .......... G01N 21/9501; G01N 21/9505; G01N 21/956; H01L 21/6831; H01L 21/6838;
(Continued)

(56) References Cited

U.S. PATENT DOCUMENTS 5,515,167 A 5/1996 Ledger et al.
7,582,491 B2 9/2009 Sasaki et al.
(Continued)

FOREIGN PATENT DOCUMENTS

JP 4230184 B2 2/2009
KR 10-2002-0045296 A 6/2002
(Continued)

OTHER PUBLICATIONS

Jonghwa Shin et al. "Three-Dimensional Metamaterials with an Ultrahigh Effective Refractive Index over a Broad Bandwidth" Physical Review Letters, vol. 102, Mar. 2009 (4 pages total).
(Continued)

*Primary Examiner* — Tarifur R Chowdhury
*Assistant Examiner* — Amanda Merlino
(74) *Attorney, Agent, or Firm* — Sughrue Mion, PLLC

(57) ABSTRACT

A semiconductor substrate processing apparatus includes: a metastructure layer divided into a plurality of microstructures by grooves, a light-transmitting dielectric substrate that supports the plurality of microstructures and is configured to allow an electromagnetic wave to be transmitted therethrough, and a frame including an exhaust hole configured to receive gas introduced from the grooves such as to provide suction force to the semiconductor substrate, wherein each of the plurality of microstructures has a smaller width than a wavelength of the electromagnetic wave, and each of the grooves has a smaller width than the wavelength of the electromagnetic wave.

20 Claims, 12 Drawing Sheets

(51) Int. Cl.
*G01N 21/956* (2006.01)
*H01L 21/683* (2006.01)

(52) U.S. Cl.
CPC ....... *G01N 21/956* (2013.01); *H01L 21/6831* (2013.01); *H01L 21/6838* (2013.01); *H01L 22/12* (2013.01); *H01L 22/26* (2013.01); *H01L 22/30* (2013.01)

(58) Field of Classification Search
CPC ..... H01L 21/6875; H01L 22/12; H01L 22/24; H01L 22/26; H01L 22/30
See application file for complete search history.

(56) References Cited

U.S. PATENT DOCUMENTS

| | | |
|---|---|---|
| 2003/0075849 A1 | 4/2003 | Choi |
| 2004/0187791 A1 | 9/2004 | Busse et al. |
| 2012/0139192 A1* | 6/2012 | Ooi ................... B25B 11/005 29/559 |
| 2012/0326944 A1 | 12/2012 | Choi et al. |
| 2018/0284071 A1 | 10/2018 | Wright |

FOREIGN PATENT DOCUMENTS

| | | | | |
|---|---|---|---|---|
| KR | 10-2003-0026088 A | 3/2003 | | |
| KR | 10-2006-0078901 A | 7/2006 | | |
| KR | 20090050319 A | * 5/2009 | ......... | H01L 21/6838 |
| KR | 10-2009-0097399 A | 9/2009 | | |
| KR | 10-2011-0128988 A | 12/2011 | | |
| KR | 10-1167692 B1 | 7/2012 | | |
| KR | 10-2013-0007690 A | 1/2013 | | |
| KR | 10-1674498 B1 | 11/2016 | | |

OTHER PUBLICATIONS

J. T. Shen et al. "Mechanism for Designing Metallic Metamaterials with a High Index of Refraction" Physical Review Letters, vol. 94, May 2005 (4 pages total).

Communication issued Oct. 18, 2024 by the Korean Intellectual Property Office in Korean Patent Application No. 10-2020-0095798.

* cited by examiner

SEMICONDUCTOR SUBSTRATE PROCESSING APPARATUS AND SEMICONDUCTOR SUBSTRATE MEASURING APPARATUS USING THE SAME

CROSS-REFERENCE TO THE RELATED APPLICATION

This application claims the benefit of Korean Patent Application No. 10-2020-0095798 filed on Jul. 31, 2020, in the Korean Intellectual Property Office, the disclosure of which is incorporated herein by reference in its entirety.

BACKGROUND

1. Field

Embodiments of the present disclosure relate to a semiconductor substrate processing apparatus and a semiconductor substrate measuring apparatus using the same.

2. Description of Related Art

A manufacturing process of a substrate for producing a semiconductor chip involves sequentially performing a plurality of processes. In this regard, in the case in which a defect occurs in any one process, the manufacturing process is performed to the last, thereby producing a defective substrate. Accordingly, it is important to find a defective substrate and remove it in order to improve productivity.

Recently, a measurement method including irradiating electromagnetic waves to measure physical properties, an internal structure, defects, or patterns of surfaces of a wafer mounted on a chuck has been used. In this case, a method of irradiating electromagnetic waves from a lower part of the chuck is being used. However, there is a problem in that many structures are disposed in the lower portion of the chuck so that electromagnetic waves irradiated thereon may be distorted before reaching the wafer.

SUMMARY

An aspect of the present disclosure is to provide a semiconductor substrate processing apparatus having improved measurement accuracy of a substrate and a semiconductor substrate measuring apparatus using the same.

According to one or more embodiments, a semiconductor substrate processing apparatus is provided. The semiconductor substrate processing apparatus includes: a metastructure layer including a first surface on which a semiconductor substrate is mounted and a second surface, opposite to the first surface, and the metastructure layer divided into a plurality of microstructures by grooves passing through the first surface and the second surface; a light-transmitting dielectric substrate including a third surface that faces the second surface and supports the plurality of microstructures, and a fourth surface, opposite to the third surface, and the light-transmitting dielectric substrate configured to allow an electromagnetic wave incident through the fourth surface to be transmitted to the third surface; and a frame surrounding an external side surface of the metastructure layer and an external side surface of the light-transmitting dielectric substrate, and including an exhaust hole disposed in a region corresponding to the external side surface of the light-transmitting dielectric substrate such as to communicate with the grooves, the exhaust hole configured to receive gas introduced from the grooves such as to provide suction force to the semiconductor substrate, wherein each of the plurality of microstructures has a smaller width than a wavelength of the electromagnetic wave, and each of the grooves has a smaller width than the wavelength of the electromagnetic wave.

According to one or more embodiments, a semiconductor substrate processing apparatus is provided. The semiconductor substrate processing apparatus includes: a light-transmitting dielectric substrate including a first surface that is configured to have an electromagnetic wave incident thereon, and a second surface, opposite to the first surface; and a metastructure layer including a third surface in contact with the second surface, and a fourth surface opposite to the third surface, and the metastructure layer is divided into a plurality of microstructures by grooves passing through the third surface and the fourth surface, wherein adjacent grooves of the grooves are spaced a part from each other at a distance that is smaller than a wavelength of the electromagnetic wave, and each of the grooves has a width that is smaller than the wavelength of the electromagnetic wave.

According to one or more embodiments, a semiconductor substrate measuring apparatus is provided. The semiconductor substrate measuring apparatus includes: a transmitter configured to emit an electromagnetic wave; a light-transmitting dielectric substrate including a first surface that is disposed such as to have the electromagnetic wave incident thereon, and a second surface opposite to the first surface; a metastructure layer including a third surface, in contact with the second surface, and a fourth surface opposite to the third surface that is configured to have a semiconductor substrate mounted thereon, and the metastructure layer is divided into a plurality of microstructures by grooves passing through the third surface and the fourth surface, each of the plurality of microstructures having a smaller width than a size of a wavelength of the electromagnetic wave and spaced apart by a distance smaller than the wavelength of the electromagnetic wave; and a receiver configured to detect the electromagnetic wave after the electromagnetic wave passes through the semiconductor substrate.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Hereinafter, various example embodiments of the present disclosure will be described with reference to the accompanying drawings.

Figure 1:
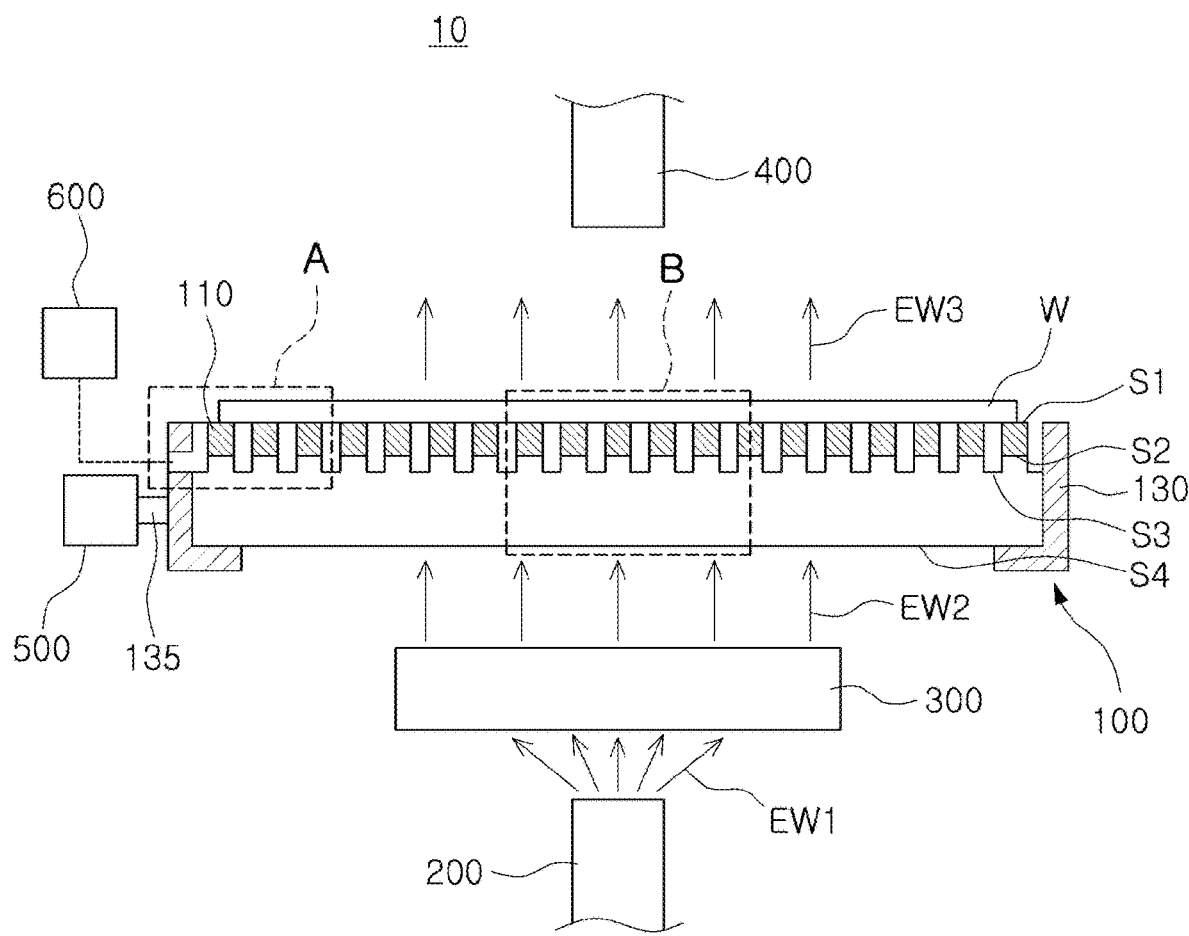
FIG. 1 is a diagram schematically illustrating a substrate measuring apparatus according to an example embodiment of the present disclosure.
Figure 2:
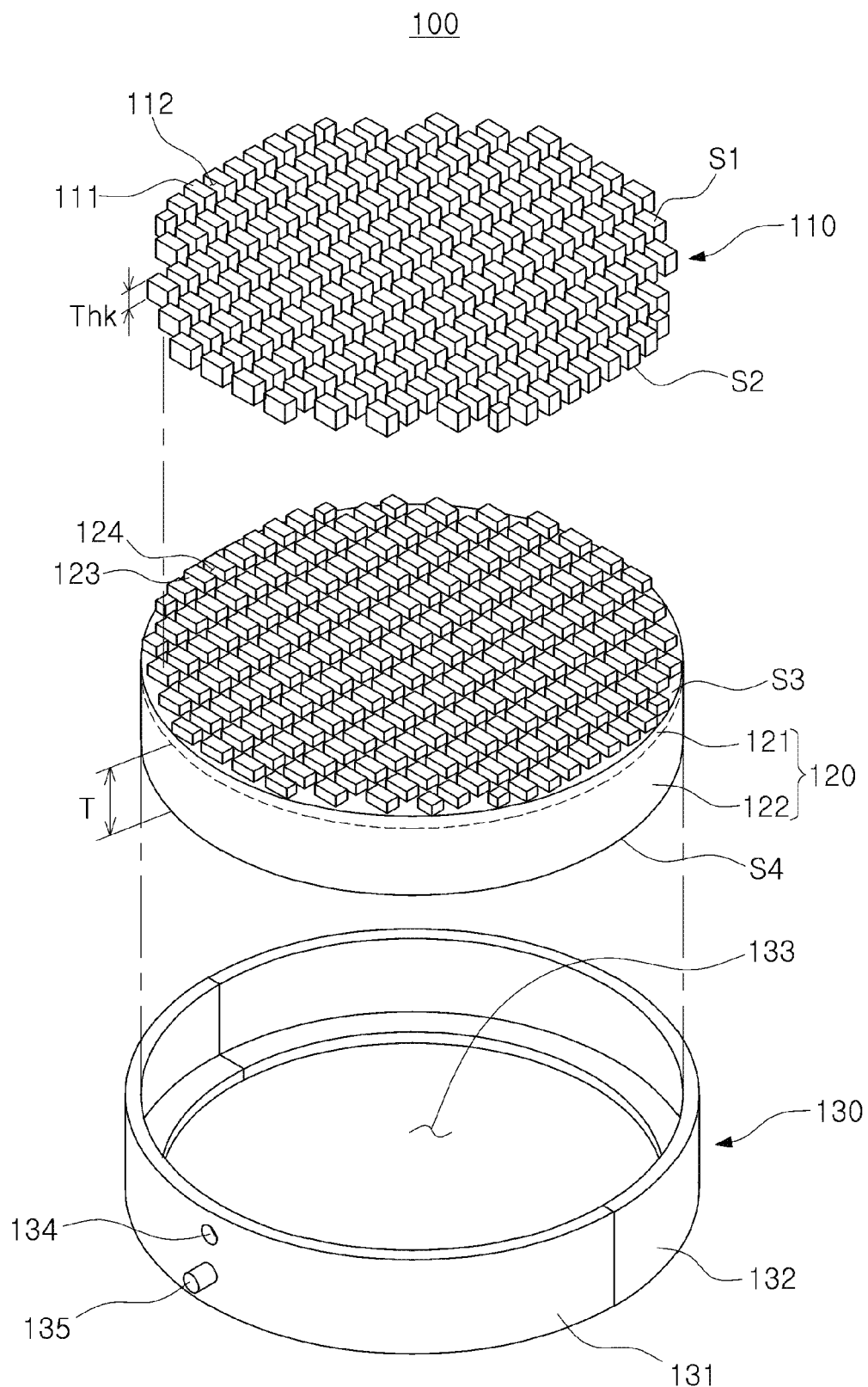
FIG. 2 is a exploded perspective view of the semiconductor substrate processing apparatus of FIG. 1.
Figure 3:
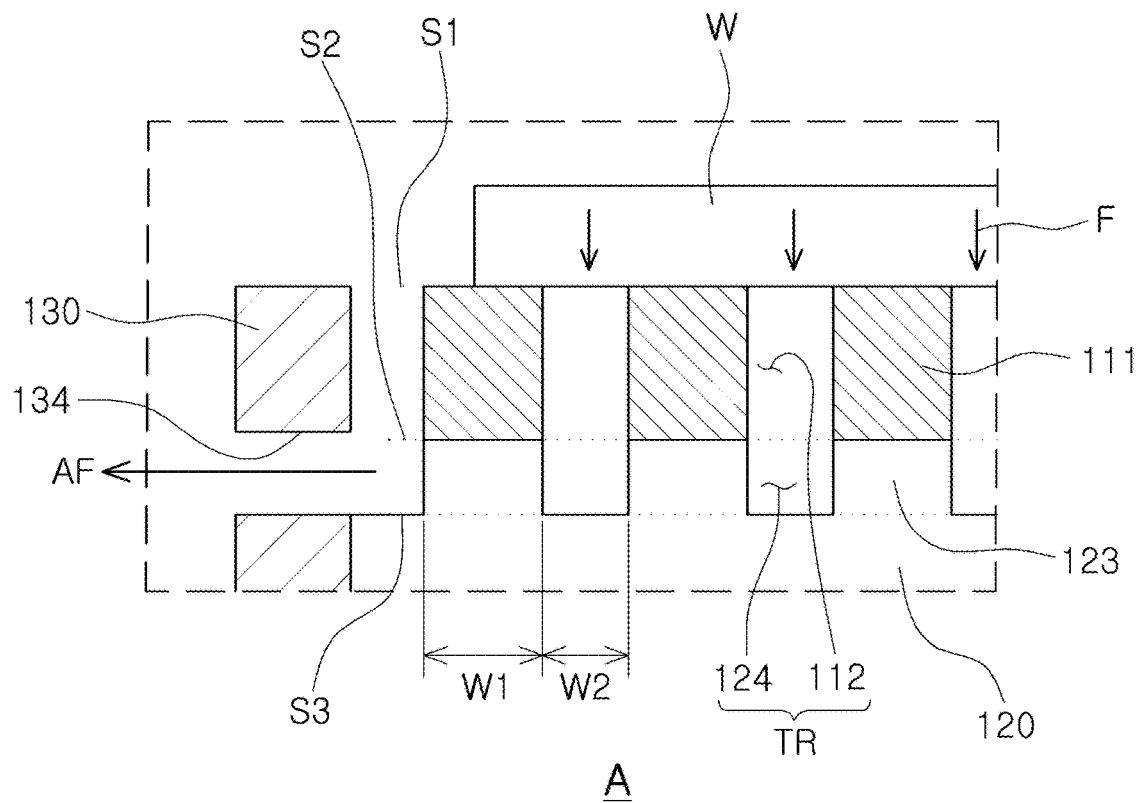
FIG. 3 is an enlarged view of area "A" of FIG. 1.

A semiconductor substrate measuring apparatus according to an example embodiment will be described with reference to FIGS. 1 to 3. FIG. 1 is a diagram schematically illustrating a substrate measuring apparatus according to an example embodiment of the present disclosure, FIG. 2 is a perspective view of the semiconductor substrate processing apparatus of FIG. 1, and FIG. 3 is an enlarged view of area "A" of FIG. 1.

Referring to FIG. 1, a semiconductor substrate measuring apparatus 10 according to an example embodiment may include a transmitter unit 200 (e.g. a transmitter) configured to emit an electromagnetic wave, an optical unit 300 (e.g. a polarizer) configured to phase-convert the electromagnetic wave emitted by the transmitter unit 200 to a plane wave, a semiconductor substrate processing apparatus 100 on which a substrate W, an object to be measured, is mounted, and a receiver unit 400 (e.g. a receiver) configured to receive the electromagnetic wave transmitted through the substrate W.

The transmitter unit 200 may be an electromagnetic wave source irradiating a pulse (hereinafter, "first electromagnetic wave (EW1)") of an electromagnetic wave having a first wavelength or longer. The transmitter unit 200 is disposed to face the semiconductor substrate processing apparatus 100 and can emit the first electromagnetic wave EW1 toward a lower portion of the semiconductor substrate processing apparatus 100. The transmitter unit 200 may emit an electromagnetic wave pulse having a frequency bandwidth of any one of visible light, infrared light, a millimeter wave, and a terahertz wave (THz wave). In the case in which the electromagnetic wave transmitted by the transmitter unit 200 is visible light, the first wavelength may be any one wavelength value of 300 nm to 700 nm. In the case of infrared light, the first wavelength may be any one wavelength value of 700 nm to 2500 nm. Further, in the case in which the electromagnetic wave transmitted by the transmitter unit 200 is a terahertz wave, the first wavelength may be any one wavelength value of 0.03 mm to 3 mm. In the case of a millimeter wave, the first wavelength may be any one wavelength value of 1 mm to 1 cm.

The optical unit 300 is disposed between the transmitter unit 200 and the semiconductor substrate processing apparatus 100 and phase-converts the electromagnetic wave emitted from the transmitter unit 200 to a plane wave (hereinafter, "second electromagnetic wave (EW2)") to allow a wave surface to be incident through a lower surface of the semiconductor substrate processing apparatus 100. The second electromagnetic wave EW2 is incident through a lower surface of the semiconductor substrate processing apparatus 100 and used in measuring physical properties, an internal structure, a defect, a pattern of a surface, or the like, of the substrate W mounted on an upper surface of the semiconductor substrate processing apparatus 100. Further, the optical unit 300 may further include an optical amplifier configured to selectively amplify a certain wavelength bandwidth of the second electromagnetic wave EW2.

The receiver unit 400 can receive an electromagnetic wave that penetrated the substrate W and the semiconductor substrate processing apparatus 100 (hereinafter, "third electromagnetic wave (EW3)") and measure physical properties, an internal structure, a defect, a pattern of a surface, or the like, of the substrate W through signal processing. In order to precisely measure a condition of the substrate W, the second electromagnetic wave EW2 incident to the substrate W should have no distortion. However, numerous structures for chucking the substrate W may be disposed inside a semiconductor substrate processing apparatus. As such structures affect the electromagnetic wave, distortion is inevitably generated while the second electromagnetic wave EW2 penetrates the structures disposed inside the semiconductor substrate processing apparatus. The semiconductor substrate processing apparatus 100 according to an example embodiment may prevent distortion of the second electromagnetic wave EW2 by minimizing the effect of the structures disposed therein on the second electromagnetic wave EW2. This will be described in detail later.

The semiconductor substrate processing apparatus 100 may be a type of a chuck table configured to chuck such that the substrate W, an object to be measured, is mounted during a process of measuring the substrate W. Depending on example embodiments, the semiconductor substrate processing apparatus 100 may be a vacuum chuck utilizing vacuum to chuck the substrate W or an electrostatic chuck utilizing electrostatic force to chuck the substrate W. In the example embodiment, the case in which the semiconductor substrate processing apparatus 100 is a vacuum chuck is assumed as a non-limiting example. The substrate W of the example embodiment may be a semiconductor substrate, such as a wafer. Depending on example embodiments, the substrate W having a circuit pattern formed on a surface thereof or thereinside may be provided.

Referring to FIGS. 1 and 2, the semiconductor substrate processing apparatus 100 may include a light-transmitting dielectric substrate 120 disposed in a direction in which the second electromagnetic wave EW2 is emitted, and a metastructure layer 110 disposed on the light-transmitting dielectric substrate 120 to support the substrate W. In addition, a frame 130 surrounding an external side surface of the metastructure layer 110 and the light-transmitting dielectric substrate 120 may be included. The semiconductor substrate processing apparatus 100 is connected to a driving unit 500 through a connector unit 135 (e.g. a connector) of the frame 130 to move along an x-axis, a y-axis, and a z-axis.

The metastructure layer 110 is a region in which the substrate W is suctioned by vacuum and seated and may be formed of a plurality of microstructures 111. The plurality of microstructures 111 is the metastructure layer 110 divided into a plurality of regions by first grooves 112. Upper surfaces of the plurality of microstructures 111 may form a coplanar first surface S1, and lower surfaces of the plurality of microstructures 111 may form a coplanar second surface S2. The first surfaces S1 and the second surfaces S2 may be disposed to be parallel to each other. The first surface S1 of the metastructure layer 110 may be prepared to have a surface area sufficient for the substrate W to be seated.

The metastructure layer 110 may be formed of a metal material or a dielectric material. The metal material may be a material, such as copper, gold, silver, aluminum, tungsten, and/or stainless steel, and the dielectric material may be a material, such as glass ($SiO_2$), polymethyl methacrylate (PMMA), polydimethylsiloxane (PDMS), polycarbonate, polystyrene, silicon (Si), ceramic, and/or quartz.

The plurality of microstructures 111 forming the metastructure layer 1110 may have a dimension of a sub-wavelength. Referring to FIG. 3, the dimension of the sub-wavelength means that a width W1 of each of the plurality of microstructures 111 is smaller than a wavelength of the second electromagnetic wave EW2 and a width W2 between the plurality of microstructures 111 is smaller than the wavelength of the second electromagnetic wave EW2. Within the dimension of the sub-wavelength, a shape of the plurality of microstructures 111 may be variously modified. For example, the plurality of microstructures 111 may have a polygonal pillar shape, a cylindrical shape, and/or a stripe shape. When the plurality of microstructures 111 have a polygonal pillar shape, the width W1 of the plurality of microstructures 111 may refer to a length of one side or a length of a diagonal line of a polygon. When the plurality of microstructures 111 have a cylindrical shape, the width W1 of the plurality of microstructures 111 may refer to a diameter. In the example embodiment, the case, in which the plurality of microstructures 111 are square pillars where the width W1 of the plurality of microstructures 111 refers to a length of one side, is assumed as a non-limiting example. An arrangement of the plurality of microstructures 111 may be periodic or non-periodic. That is, the shape and arrangement of the plurality of microstructures 111 may be freely modified within the dimension of the sub-wavelength. However, the thickness Thk of the plurality of microstructures 111 is not limited to the sub-wavelength dimension. As the second electromagnetic wave EW2 is a plane wave, the thickness Thk of the plurality of microstructures 111 having a length in the same direction as a traveling direction of the plane wave does not affect the second electromagnetic wave EW2 even when the thickness THk is not equal to the sub-wavelength dimension.

As the width W2 between the plurality of microstructures 111 is arranged to have the dimension of the sub-wavelength, the width W2 of the first grooves 112 dividing the metastructure layer 110 into the plurality of microstructures 111 may also have the sub-wavelength dimension. Referring to FIG. 3, the first grooves 112 are spaces for separating the plurality of microstructures 111 from each other and are connected to a vacuum source 600 through an exhaust hole 134 of the frame 130 to be used as a vacuum groove for providing suction force F to the substrate W mounted on the metastructure layer 110. As the width W2 of the first grooves 112 has the sub-wavelength dimension, the first grooves 112 may be formed to have a very small size as compared to the vacuum hole of a conventional vacuum chuck. In addition, as the first grooves 112 are entirely dispersed on a surface of the metastructure layer 110, the suction force F provided to the substrate W is not concentrated on only a portion of the substrate W and may act as a whole on a side on which the substrate W is mounted. In the case of a conventional vacuum chuck in which the suction force is highly concentrated only in a region in which the vacuum hole is formed, the suction force is concentrated in the region in which the vacuum hole is disposed, thereby generating warpage on the substrate. In contrast, in the example embodiment, the suction force acts evenly on a surface on which the substrate W is seated, and warpage may be prevented from being generated on the substrate W due to the concentrated suction force.

As the width W1 of and the width W2 between the plurality of microstructures 111 are formed to have the sub-wavelength dimension smaller than the wavelength of the second electromagnetic wave EW2, the metastructure layer 110, in spite of being divided into the plurality of microstructures 111 by the first grooves 112, may act on the second electromagnetic wave EW2 as a metastructure in which the first grooves 112 are not formed. The term "metastructure" refers to an artificial structure formed to have a smaller dimension than the wavelength of an incident electromagnetic wave and exhibiting optical characteristics which may not be present in nature by a shape thereof, not physical properties. In the case of the example embodiment, the metastructure layer 110 forms a metastructure for the second electromagnetic wave EW2 such that the plurality of microstructures 111 and the first grooves 112 have a same refractive index. Accordingly, distortion can be prevented when the second electromagnetic wave EW2 passes through the metastructure layer 110.

Figure 7A:
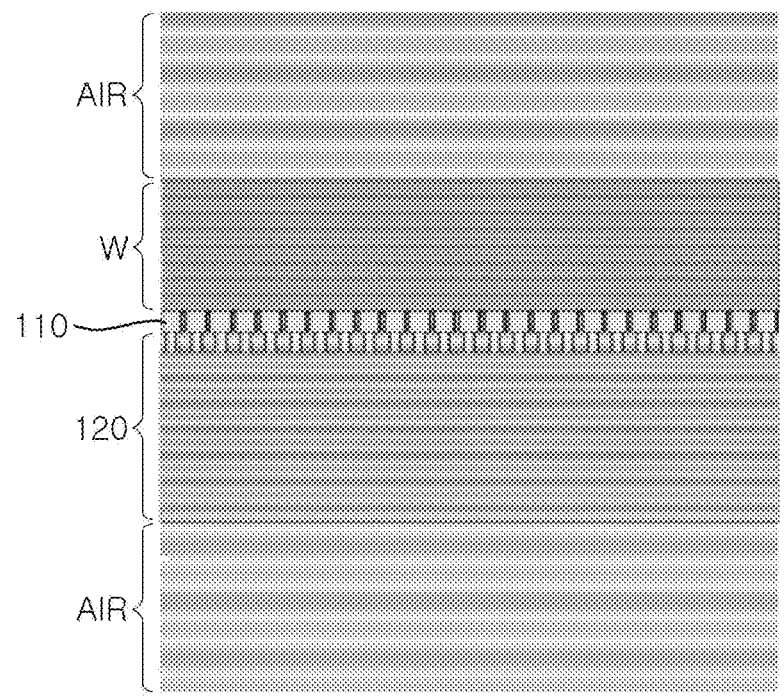
FIG. 7A is a diagram illustrating a result of a simulation of electromagnetic wave transmissions of an example embodiment of the present disclosure with respect to area "B" of FIG. 1.
Figure 7B:
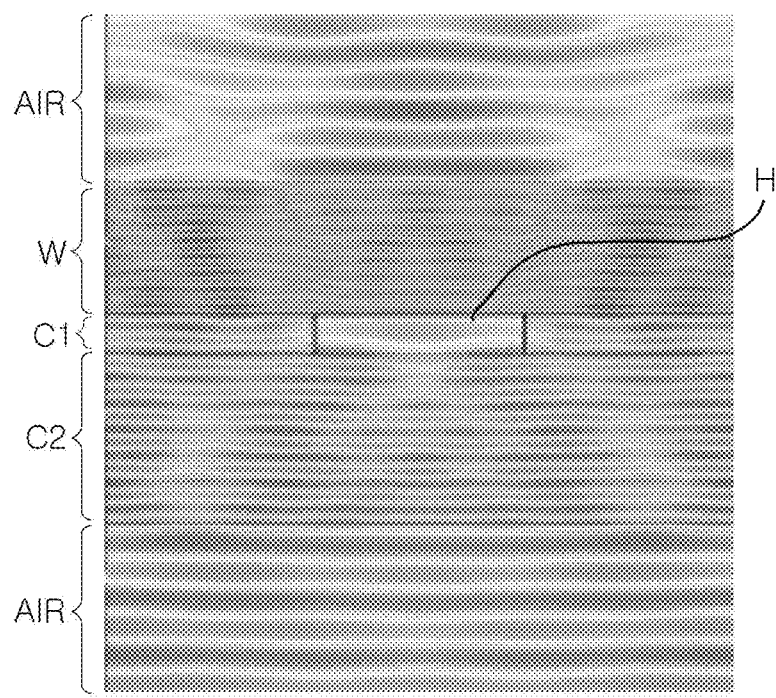
FIG. 7B is a diagram illustrating a result of a simulation of electromagnetic wave transmissions of a comparative example.

FIGS. 7A and 7B are diagrams illustrating a result of a simulation of electromagnetic wave transmission of an example embodiment of the present disclosure and that of a comparative example with respect to area "B" of FIG. 1. The example embodiment of FIG. 7A is the case in which the metastructure layer 110 is disposed on the light-transmitting dielectric substrate 120, and that of FIG. 7B is the case in which a plate C1 in which a vacuum hole H having a conventional diameter is disposed on a light-transmitting dielectric substrate C2. The example embodiment and the comparative example are identical in that an electromagnetic pulse, a plane wave, is irradiated on the light-transmitting dielectric substrate through air.

In the example embodiment, the electromagnetic pulse irradiated through the air is irradiated to the substrate W through the light-transmitting dielectric substrate 120 and the metastructure layer 110 but is incident to the substrate W as a plane wave without distortion of a signal. In the comparative example, however, the electromagnetic wave pulse is diffracted around the hole H of the plate C1, thereby distorting the electromagnetic wave pulse incident to the substrate W.

Figure 8:
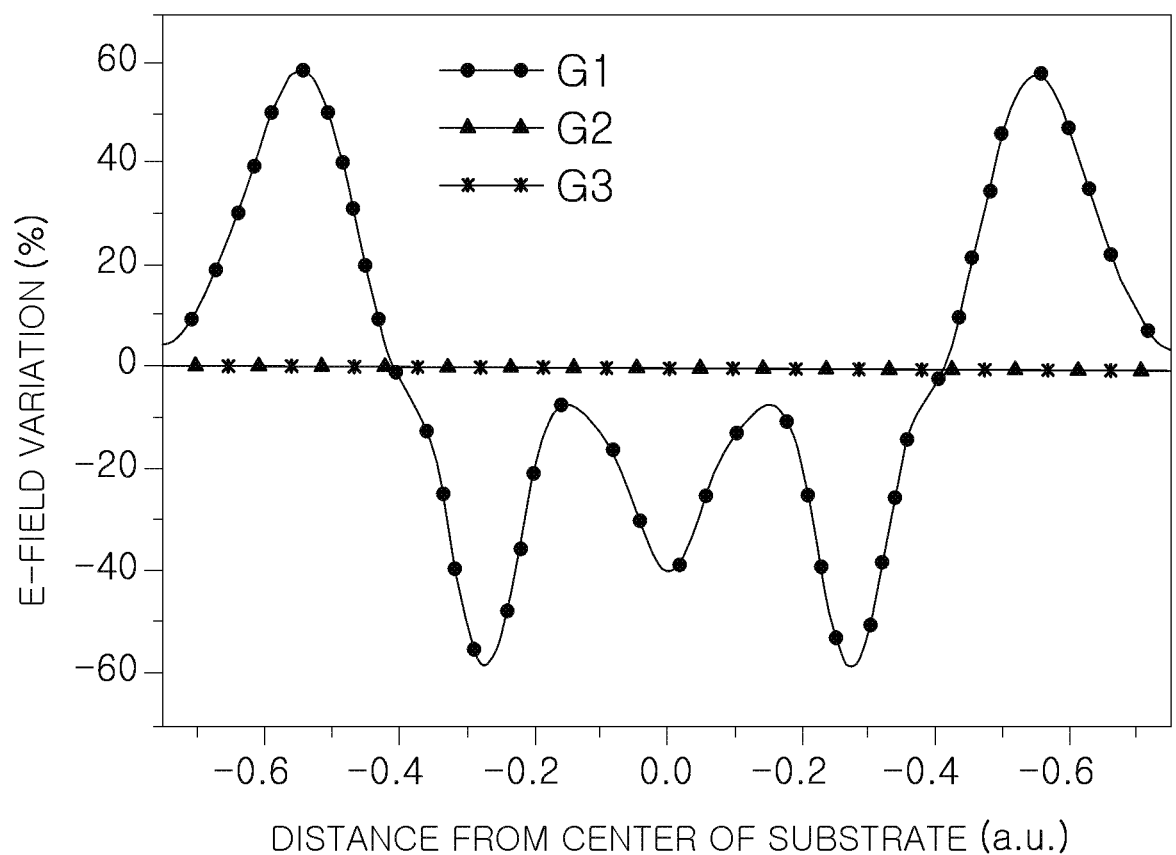
FIG. 8 is a graph illustrating a change in an electromagnetic field measured on an upper surface of a semiconductor substrate processing apparatus of an example embodiment of the present disclosure and that of a comparative example.

FIG. 8 is a graph illustrating a change in an electromagnetic field measured on an upper surface of a semiconductor substrate processing apparatus of example embodiments of the present disclosure and that of a comparative example. G1 of FIG. 8 is a graph of the comparative example, and G2 and G3 are graphs of example embodiments of the present disclosure. G2 is the case in which the thickness Thk of the metastructure layer is $\lambda/5$, G3 is the case in which the thickness Thk of the metastructure layer is $2\lambda$.

In the case of G1, an electric field is not uniform and different by up to 120% depending on a position thereof. In contrast, in the cases of G1 and G2, the electric field is uniform regardless of the position thereof. Further, in the case of G1 and G2, the electric field is uniform regardless of the thickness Thk of the metastructure layer.

The light-transmitting dielectric substrate 120 is a substrate having a third surface S3 facing the metastructure layer 110 and a fourth surface S4 positioned on a surface opposite to the third surface S3 and into which the second electromagnetic wave EW2 is incident, and may have a shape corresponding to an outer shape of the metastructure layer 110. The third surface S3 and the fourth surface S4 may be disposed to be parallel to each other. Alternately, the third surface S3 and the fourth surface S4 may be disposed such that the first surface S1 and the second surface S2 of the metastructure layer 110 are parallel to each other.

The light-transmitting dielectric substrate 120 is used as a support, supporting the metastructure layer 110, and can thus be prepared to have a sufficient thickness T. In an example embodiment, the thickness T of the light-transmitting dielectric substrate 120 may be larger than the thickness Thk of the metastructure layer 110, but is not limited thereto. The thickness T of the light-transmitting dielectric substrate 120 may be variously modified. Depending on example embodiments, the light-transmitting dielectric substrate 120 may be a multilayer structure, and the layers thereof may include different light-transmitting materials. In the example embodiment, the light-transmitting dielectric substrate 120 including a first light-transmitting dielectric substrate 121 and a second light-transmitting dielectric substrate 122 stacked on each other is assumed as a non-limiting example.

Further, the light-transmitting dielectric substrate 120 may be formed of a material having sufficient rigidity to support the metastructure layer 110 while having sufficient light-transmitting properties to allow the incident second electromagnetic wave EW2 to penetrate therethrough. The light-transmitting dielectric substrate 120 may be formed of a light-transmitting dielectric material, and as the light-transmitting dielectric substrate 120, a material, such as glass ($SiO_2$), polymethyl methacrylate (PMMA), polydimethylsiloxane (PDMS), polycarbonate, polystyrene, silicon (Si), ceramic, and/or quartz, can be included.

The plurality of microstructures 111 of the metastructure layer 110 may be disposed on the third surface S3 of the light-transmitting dielectric substrate 120. The plurality of microstructures 111 can be disposed directly on the third surface S3, or may be disposed to correspond to a plurality of supporting portions 123 protruded to correspond to the plurality of microstructures 111 on the third surface S3, depending on example embodiments.

The plurality of supporting portions 123 may be disposed so as to include second grooves 124 having the same width W2 in a position corresponding to the first grooves 112 of the metastructure layer 110. The plurality of supporting portions 123 may have the same width W1 as the plurality of microstructures 111, but depending on example embodiments, may have a larger width than the plurality of microstructures 111. As illustrated in FIG. 3, the second grooves 124 may be formed to extend to a lower portion of the first grooves 112 to form a trench structure TR together with the first grooves 112. Identically to the first grooves 112, the second grooves 124 may have a flow path AF through which gas inside the second grooves 124 are discharged through the exhaust hole 134 of the frame 130. Accordingly, the second grooves 124 may also be connected to the vacuum source 600 and used in providing suction force to the substrate W mounted on the metastructure layer 110.

Figure 4:
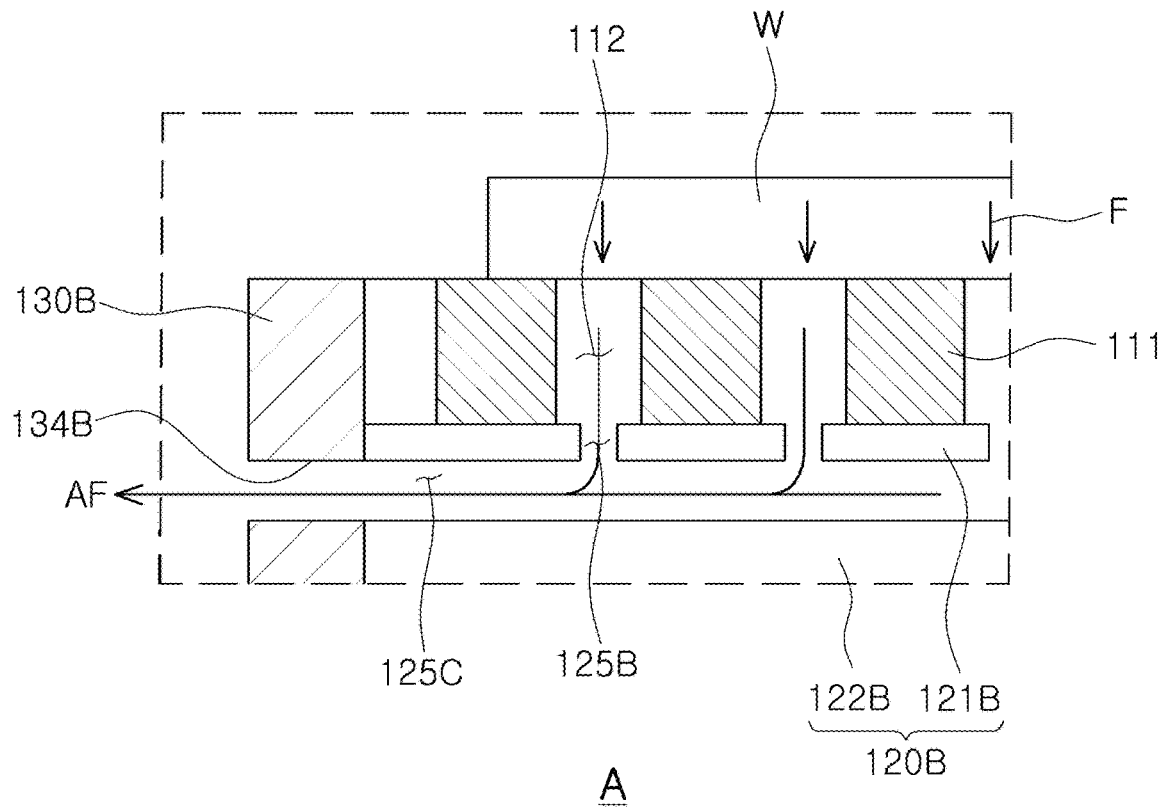
FIG. 4 is a diagram illustrating a modified example of the semiconductor substrate processing apparatus of FIG. 3.

FIG. 4 is a diagram illustrating a modified example of the semiconductor substrate processing apparatus of FIG. 3. FIG. 4 illustrates the case in which a light-transmitting dielectric substrate 120B is formed of a first light-transmitting dielectric substrate 121B and a second light-transmitting dielectric substrate 122B. An air intake hole 125B and an air intake path 125C may be formed in the first light-transmitting dielectric substrate 121B. The air intake hole 125B may be formed through the first light-transmitting dielectric substrate 121B and may be connected to an exhaust hole 134B of a frame 130B through the air intake path 125C connected to the air intake hole 125B. The flow path AF through which gas is sucked from the first grooves 112 through the air intake hole 125B may be formed to provide suction force F to the substrate W.

Figure 5A:
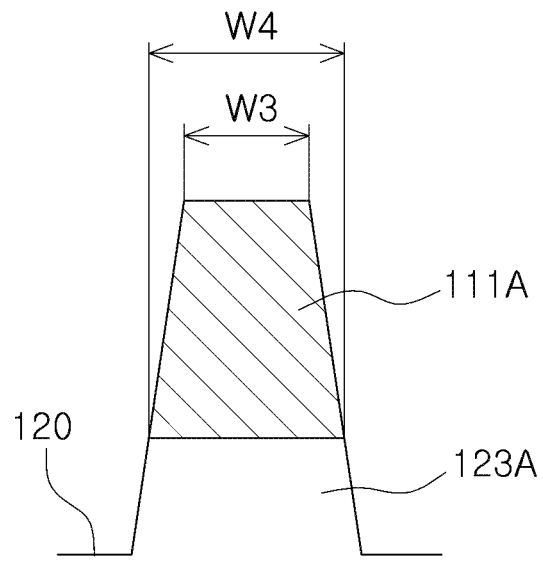
FIG. 5A is a diagram illustrating a modified example of a microstructure of FIG. 4.
Figure 5B:
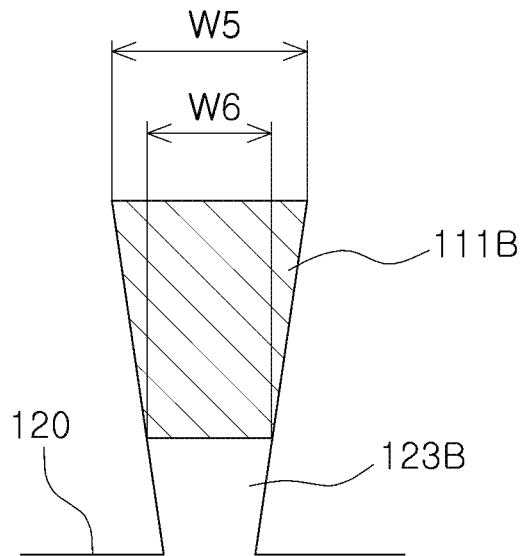
FIG. 5B is a diagram illustrating a modified example of a microstructure of FIG. 4.
Figure 5C:
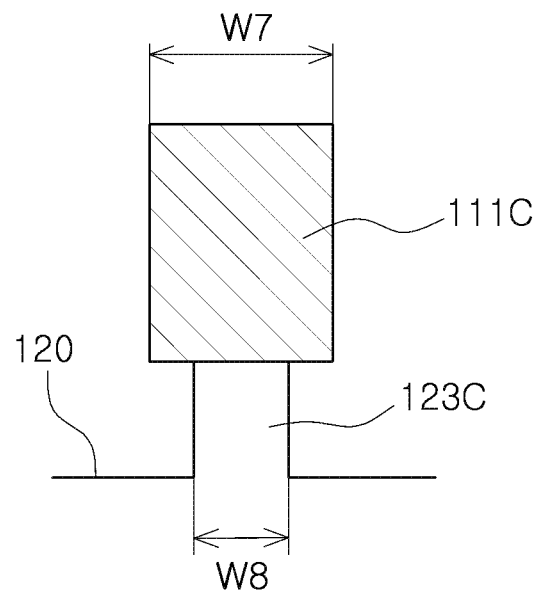
FIG. 5C is a diagram illustrating a modified example of a microstructure of FIG. 4.

FIGS. 5A to 5C are diagrams illustrating various modified examples of a microstructure of FIG. 4. FIG. 5A illustrates the case in which a plurality of microstructures 111A have a trapezoidal shape in which a width W3 of an upper surface is smaller than a width W4 of a lower surface, and supporting portions 123A are also formed to have a trapezoid shape so as to have a greater width than the width W4 of the lower surface of the plurality of microstructures 111A. In contrast, FIG. 5B illustrates the case in which a plurality of microstructures 111B have an inverted trapezoidal shape in which a width W5 of an upper surface is greater than a width W6 of a lower surface, and supporting portions 123B are also formed to have a trapezoid shape so as to have a smaller width than the width W6 of the lower surface. FIG. 5C illustrates the case in which a plurality of microstructures 111C have a shape of a square pillar having a constant width W7, and a width W8 of support portions 123C is smaller than the width W7 of the plurality of microstructures 111C.

Figure 6A:
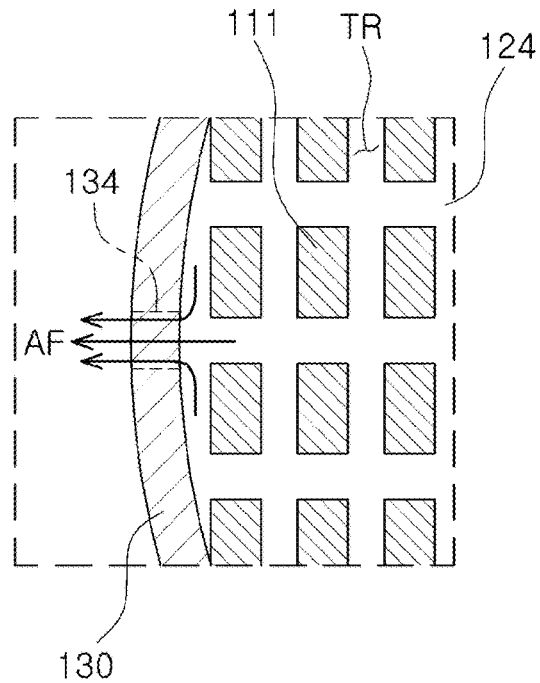
FIG. 6A is a diagram illustrating a modified example of a microstructure of FIG. 4.
Figure 6B:
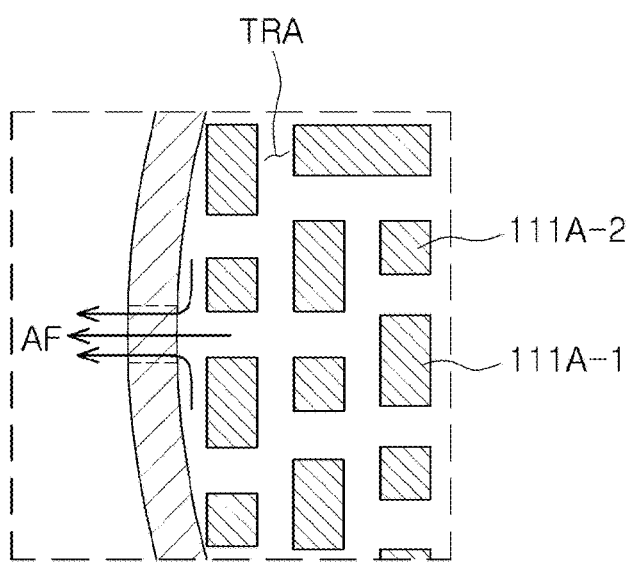
FIG. 6B is a diagram illustrating a modified example of a microstructure of FIG. 4.
Figure 6C:
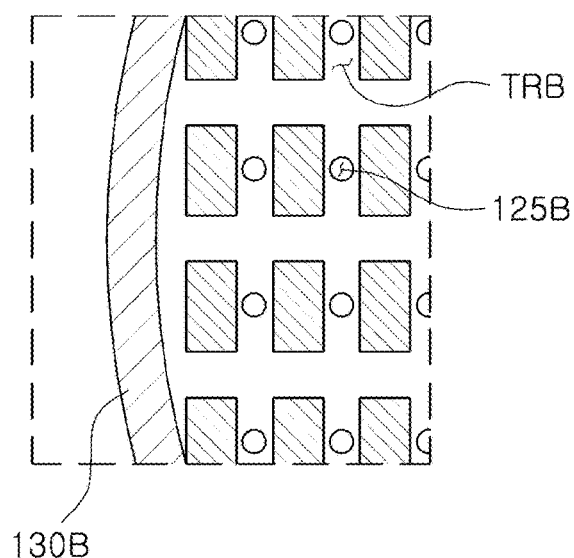
FIG. 6C is a diagram illustrating a modified example of a microstructure of FIG. 4.

FIGS. 6A to 6C are diagrams illustrating various modified examples of a microstructure of FIG. 4. FIG. 6A illustrates the case in which a plurality of microstructures 111 in a periodic arrangement form are spaced apart by a trench structure TR having a predetermined interval. FIG. 6B illustrates the case in which a plurality of microstructures 111A-1 and 111A-2 having different sizes are mixed and disposed, and spaced apart by a trench structure TRA. FIG. 6C, although being similar to FIG. 6A, illustrates the case in which an air intake hole 125B is further formed in a lower surface of a trench structure TRB.

Figure 9:
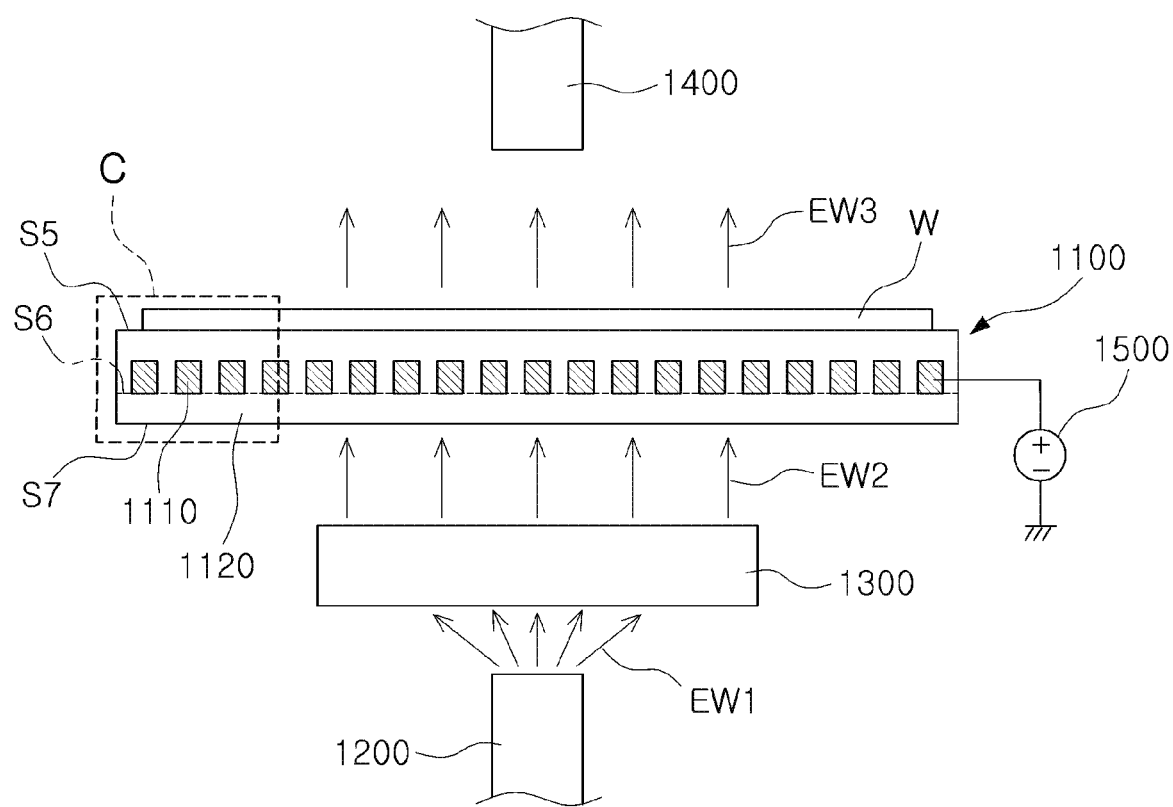
FIG. 9 is a diagram schematically illustrating a semiconductor substrate measuring apparatus according to an example embodiment.

A semiconductor substrate measuring apparatus 20 according to an example embodiment will be described with reference to FIGS. 9 and 10. FIG. 9 is a diagram schematically illustrating a semiconductor substrate measuring apparatus according to an example embodiment, and FIG. 10 is an enlarged view of area "C" of FIG. 9.

Referring to FIG. 9, an example embodiment is similar to the example embodiment previously described in that a first electromagnetic wave EW1 emitted from a transmitter unit 1200 is subject to phase-convert to a second electromagnetic wave EW2, a plane wave, through an optical unit 1300 and irradiated to a semiconductor substrate processing apparatus 1100, and a third electromagnetic wave EW3 that penetrated a substrate W mounted in the semiconductor substrate processing apparatus 1100 is incident to a receiver unit 1400. Descriptions of the same components will be omitted to avoid repetition.

In contrast to the previously described example embodiments, the semiconductor substrate processing apparatus 1100 is an electrostatic chuck and has a structure in which the substrate W is chucked by electrostatic force formed by a power source 1500 connected to a metastructure layer 1110.

Figure 10:
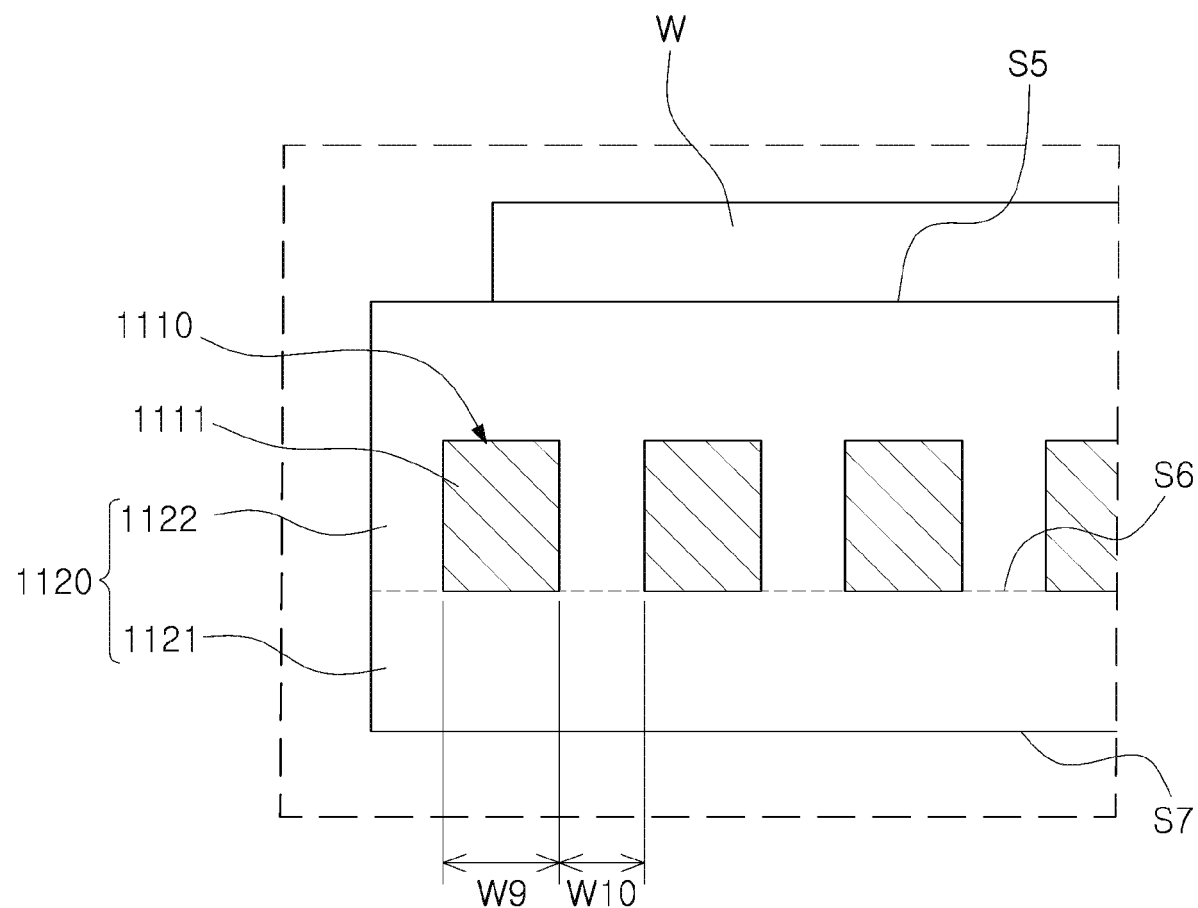
FIG. 10 is an enlarged view of area "C" of FIG. 9.

Similarly to the previously described example embodiments, in FIGS. 9 and 10, the metastructure layer 1110 includes a plurality of microstructures 1111, and each of the plurality of microstructures 1111 has a narrower width W9 and a smaller distance W10 than a size of a wavelength of the irradiated second electromagnetic wave EW2. The metastructure layer 1110 of the example embodiment may also act on the second electromagnetic wave EW2 as a metastructure, identically to the previously described example embodiments.

Different from previously described example embodiments, in an example embodiment, a light-transmitting dielectric substrate 1120 is formed of a base layer 1121 and a cover layer 1122. The base layer 1121 is a support layer disposed on a lower portion of the metastructure layer 1110 and may have a sixth surface S6, on which the metastructure layer 1110 is disposed, and a seventh surface S7 to which an electromagnetic wave is incident. The cover layer 1122 may provide a fifth surface S5 covering and encapsulating the metastructure layer 1110 to allow the substrate W to be seated. The base layer 1121 and the cover layer 1122 may be formed of a light-transmitting dielectric material. As the light-transmitting dielectric material, a material, such as glass ($SiO_2$), polymethyl methacrylate (PMMA), polydimethylsiloxane (PDMS), polycarbonate, polystyrene, silicon (Si), ceramic, and/or quartz, can be included.

A process of manufacturing a semiconductor substrate processing apparatus 100 according to an example embodiment will be described with reference to FIGS. 11A to 11D. FIGS. 11A to 11D are diagrams schematically illustrating a manufacturing process of a semiconductor substrate measuring apparatus according to an example embodiment, thereby providing the semiconductor substrate processing apparatus 100 of FIG. 1.

Figure 11A:
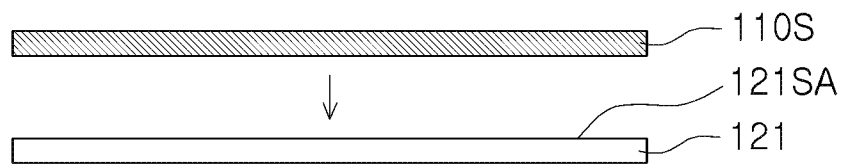
FIG. 11A is a first diagram schematically illustrating a manufacturing process of a semiconductor substrate measuring apparatus according to an example embodiment.

Referring to FIG. 11A, a first light-transmitting dielectric substrate 121 may be prepared, and a material layer 1105 may be formed on an upper surface 121SA of the first light-transmitting dielectric substrate 121. The material layer 1105 may be attached to the first light-transmitting dielectric substrate 121 using a thermal bonding process, but is not limited thereto. The material layer 1105 may be formed by various methods such as deposition. The material layer 1105 may be formed of a metal material or a dielectric material, and the first light-transmitting dielectric substrate 121 may be formed of a light-transmitting dielectric material. Specifically, the material layer 1105 may be formed of a metal material, such as copper, gold, silver, aluminum, tungsten, and/or stainless steel, and the dielectric material, such as glass ($SiO_2$), polymethyl methacrylate (PMMA), polydimethylsiloxane (PDMS), polycarbonate, polystyrene, silicon (Si), ceramic, and/or quartz. The first light-transmitting dielectric substrate 121 may be formed of a light-transmitting dielectric material, such as glass ($SiO_2$), polymethyl methacrylate (PMMA), polydimethylsiloxane (PDMS), polycarbonate, polystyrene, silicon (Si), ceramic, and/or quartz.

Figure 11B:
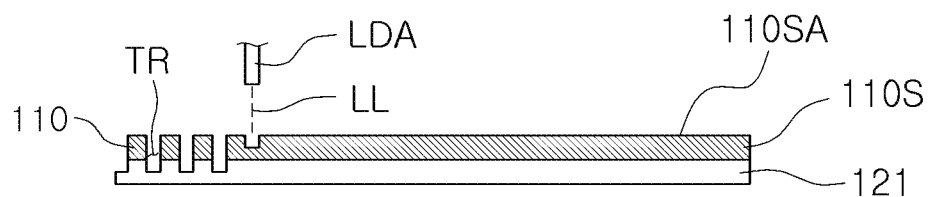
FIG. 11B is a second diagram schematically illustrating the manufacturing process of the semiconductor substrate measuring apparatus according to the example embodiment.

Referring to FIG. 11B, the metastructure layer 110 may be formed on the upper surface 110SA of the material layer 1105 by forming the trench structure TR penetrating the material layer 1105. The trench structure TR may be formed to further etch a portion of the first light-transmitting dielectric substrate 121 as well as the material layer 110S. The trench structure TR may be formed by irradiating laser light LL toward the upper surface 110SA of the material layer 110S with a laser drilling machine LDA. A spot of the laser light LL may be provided to have a sufficiently small diameter such that a width of the trench structure TR is smaller than a wavelength of the electromagnetic wave to be irradiated. The spot of the laser light LL may be irradiated such that the interval of the trench structure TR is smaller than the wavelength of the electromagnetic wave to be irradiated.

Figure 11C:
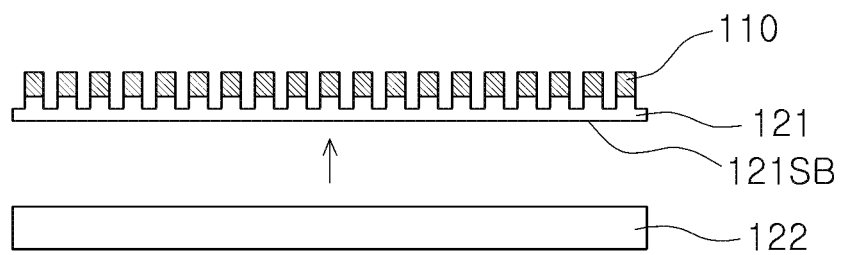
FIG. 11C is a third diagram schematically illustrating the manufacturing process of the semiconductor substrate measuring apparatus according to the example embodiment.

Referring to FIG. 11C, a second light-transmitting dielectric substrate 122, which is a support substrate, may be bonded to a lower surface 121SB of the first light-transmitting dielectric substrate 121 in order to supplement rigidity of the metastructure layer 110 and the first light-transmitting dielectric substrate 121. When the second light-transmitting dielectric substrate 122 is formed of the same material as the first light-transmitting dielectric substrate 121 and is bonded thereto, the first light-transmitting dielectric substrate 121 and the 122 second light-transmitting dielectric substrate can be integrated.

Figure 11D:
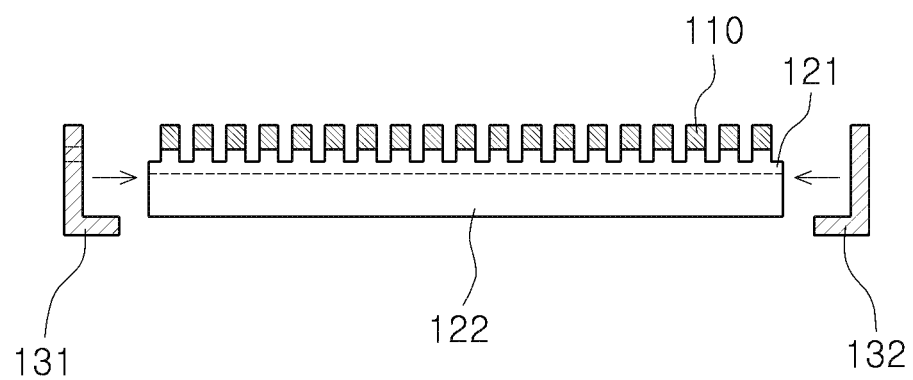
FIG. 11D is a fourth diagram schematically illustrating the manufacturing process of the semiconductor substrate measuring apparatus according to the example embodiment.

Referring to FIG. 11D, a first frame 131 and a second frame 132 may be bonded such that the metastructure layer 110 and side surfaces of the first light-transmitting dielectric substrate 121 and the second light-transmitting dielectric substrate 122 are surrounded.

A process of manufacturing a semiconductor substrate processing apparatus 100 according to an example embodiment will be described with reference to FIGS. 12A to 12E. FIGS. 12A to 12E are diagrams schematically illustrating a manufacturing process of a semiconductor substrate measuring apparatus according to an example embodiment, thereby providing the semiconductor substrate processing apparatus 100 of FIG. 1.

Figure 12A:
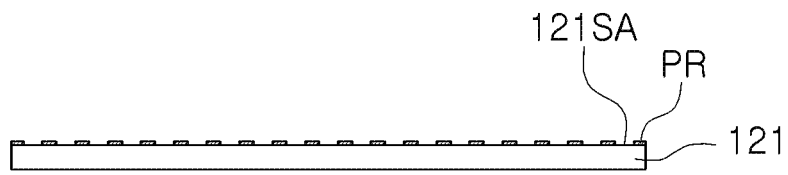
FIG. 12A is a first diagram schematically illustrating a manufacturing process of a semiconductor substrate measuring apparatus according to an example embodiment.

Referring to FIG. 12A, a first light-transmitting dielectric substrate 121 may be prepared, and a photoresist pattern PR may be formed on an upper surface 121SA thereof. A portion in which the photoresist pattern PR is formed may be etched in a subsequent process to form a trench structure, and in a portion in which the photoresist pattern PR is not formed, a plurality of microstructures may be formed in a subsequent process.

Figure 12B:
FIG. 12B is a second diagram schematically illustrating the manufacturing process of the semiconductor substrate measuring apparatus according to the example embodiment.

Referring to FIG. 12B, a plating layer may be formed in the region of the upper surface of the first light-transmitting dielectric substrate 121, in which the photoresist pattern PR is not formed, thereby forming a metastructure layer 110 formed of a plurality of microstructures.

Figure 12C:
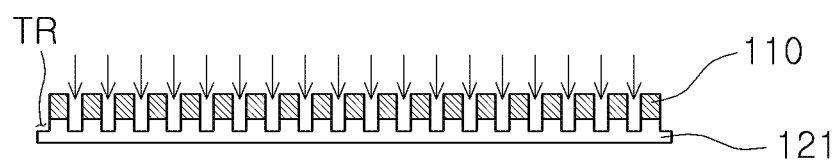
FIG. 12C is a third diagram schematically illustrating the manufacturing process of the semiconductor substrate measuring apparatus according to the example embodiment.

Referring to FIG. 12C, a trench structure TR can be formed by etching the region of the upper surface of the first light-transmitting dielectric substrate 121, in which the photoresist pattern PR is formed.

Figure 12D:
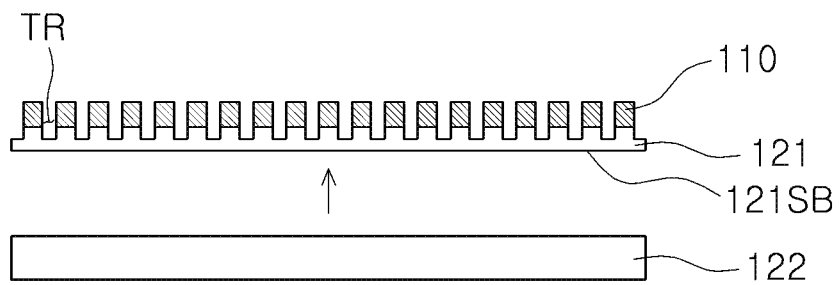
FIG. 12D is a fourth diagram schematically illustrating the manufacturing process of the semiconductor substrate measuring apparatus according to the example embodiment.

Referring to FIG. 12D, a second light-transmitting dielectric substrate 122, a support substrate, may be bonded to a lower surface 121SB of the first light-transmitting dielectric substrate 121 in order to supplement rigidity of the metastructure layer 110 and the first light-transmitting dielectric substrate 121.

Figure 12E:
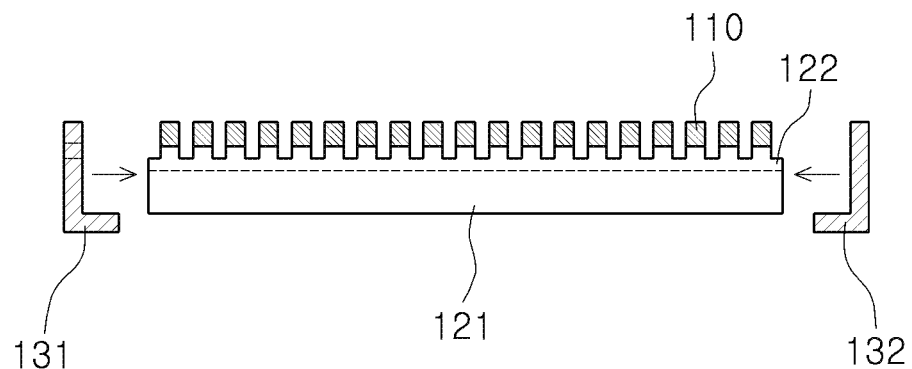
FIG. 12E is a fifth diagram schematically illustrating the manufacturing process of the semiconductor substrate measuring apparatus according to the example embodiment.

Referring to FIG. 12E, a first frame 131 and a second frame 132 may be bonded such that the metastructure layer 110 and side surfaces of the first light-transmitting dielectric substrate 121 and the second light-transmitting dielectric substrate 122 are surrounded.

Figure 13A:
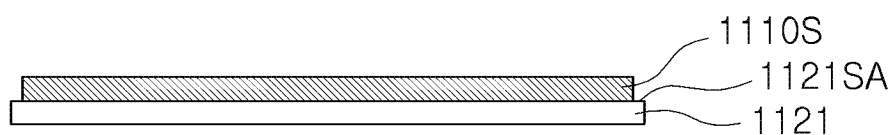
FIG. 13A is a first diagram schematically illustrating a manufacturing process of a semiconductor substrate measuring apparatus according to an example embodiment.
Figure 13B:
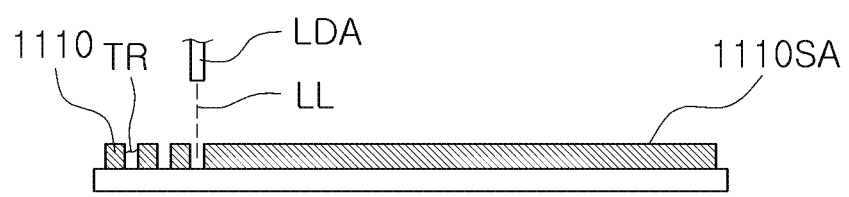
FIG. 13B is a second diagram schematically illustrating the manufacturing process of the semiconductor substrate measuring apparatus according to the example embodiment.
Figure 13C:
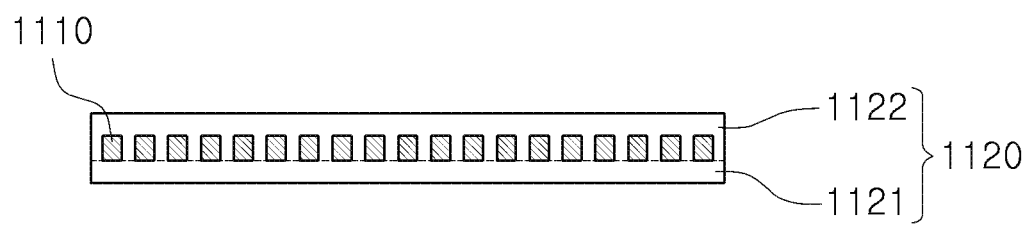
FIG. 13C is a third diagram schematically illustrating the manufacturing process of the semiconductor substrate measuring apparatus according to the example embodiment.

A process of manufacturing a semiconductor substrate processing apparatus 100 according to an example embodiment will be described with reference to FIGS. 13A to 13C. FIGS. 13A to 13C are diagrams schematically illustrating a manufacturing process of a semiconductor substrate measuring apparatus according to an example embodiment, thereby providing the semiconductor substrate processing apparatus 1100 of FIG. 9.

Referring to FIG. 13A, a material layer 1110S may be bonded to an upper surface 1121SA of a base layer 1121. Since materials forming the material layer 1110S and the base layer 1121 are the same as the material forming the first light-transmitting dielectric substrate of the above described example embodiment, detailed descriptions thereof will be omitted.

Referring to FIG. 13B, a metastructure layer 1110 may be formed by forming a trench structure TR penetrating the material layer 1110S on the upper surface 1110SA of the material layer 1110S. The trench structure TR may be formed by irradiating laser light LL toward the upper surface 1110SA of the material layer 1110S with a laser drilling machine LDA.

Referring to FIG. 13C, a cover layer 1122 may be formed to cover the metastructure layer 1110 and the base layer 1121. Since the cover layer 1122 is formed of the same material as the base layer 1121, the cover layer 1122 and the base layer 1121 may form an integral light-transmitting dielectric substrate 1120.

As set forth above, a semiconductor substrate processing apparatus including a metastructure disposed therein for preventing distortion of an electromagnetic wave passing through a chuck table so as to prevent the electromagnetic wave passing through the chuck table from being distorted, and a semiconductor substrate measuring apparatus using the same can be provided.

Various advantages and beneficial effects of embodiments of the present disclosure are not limited to the above descriptions and may be easily understood in the course of describing a specific example embodiment.

While example embodiments have been shown and described above, it will be apparent to those skilled in the art that modifications and variations could be made without departing from the scope of the present disclosure.

What is claimed is:

1. A semiconductor substrate processing apparatus, comprising:
   a metastructure layer comprising a first surface on which a semiconductor substrate is mounted and a second surface, opposite to the first surface, and the metastructure layer divided into a plurality of microstructures by grooves passing through the first surface and the second surface;
   a light-transmitting dielectric substrate comprising a third surface that faces the second surface and supports the plurality of microstructures, and a fourth surface, opposite to the third surface, and the light-transmitting dielectric substrate configured to allow an electromagnetic wave incident through the fourth surface to be transmitted to the third surface; and
   a frame surrounding an external side surface of the metastructure layer and an external side surface of the light-transmitting dielectric substrate, and comprising an exhaust hole disposed in a region corresponding to the external side surface of the light-transmitting dielectric substrate such as to communicate with the grooves, the exhaust hole configured to receive gas introduced from the grooves such as to provide suction force to the semiconductor substrate,
   wherein each of the plurality of microstructures has a smaller width than a wavelength of the electromagnetic wave, and each of the grooves has a smaller width than the wavelength of the electromagnetic wave.

2. The semiconductor substrate processing apparatus of claim 1, wherein the metastructure layer comprises at least one from among a metal material and a dielectric material.

3. The semiconductor substrate processing apparatus of claim 1, wherein a surface area of the first surface of the metastructure layer is larger than a surface area of the semiconductor substrate that is in contact with the first surface.

4. The semiconductor substrate processing apparatus of claim 1, further comprising a vacuum source connected to the exhaust hole.

5. The semiconductor substrate processing apparatus of claim 1, wherein the light-transmitting dielectric substrate further comprises a plurality of support portions that protrudes on the third surface such as to correspond to the plurality of microstructures of the metastructure layer.

6. The semiconductor substrate processing apparatus of claim 1, wherein each of the plurality of microstructures has a shape comprising at least one from among a polygonal pillar shape, a cylindrical shape, and a stripe shape.

7. The semiconductor substrate processing apparatus of claim 1, wherein the light-transmitting dielectric substrate further comprises:
   a first light-transmitting dielectric substrate that comprises the third surface; and
   a second light-transmitting dielectric substrate that comprises the fourth surface.

8. The semiconductor substrate processing apparatus of claim 7, wherein the first light-transmitting dielectric substrate further comprises air intake holes that communicate with the exhaust hole and are disposed in regions corresponding to the grooves.

9. The semiconductor substrate processing apparatus of claim 1, wherein the first to fourth surfaces are parallel to each other.

10. A semiconductor substrate processing apparatus, comprising:
    a light-transmitting dielectric substrate comprising a first surface that is configured to have an electromagnetic wave incident thereon, and a second surface, opposite to the first surface; and
    a metastructure layer comprising a third surface in contact with the second surface, and a fourth surface opposite to the third surface, and the metastructure layer is divided into a plurality of microstructures by grooves passing through the third surface and the fourth surface, wherein adjacent grooves of the grooves are spaced a part from each other at a distance that is smaller than a wavelength of the electromagnetic wave, and each of the grooves has a width that is smaller than the wavelength of the electromagnetic wave.

11. The semiconductor substrate processing apparatus of claim 10, further comprising a cover layer covering the plurality of microstructures.

12. The semiconductor substrate processing apparatus of claim 11, wherein the cover layer is formed of a light-transmitting material.

13. The semiconductor substrate processing apparatus of claim 11, further comprising a power supply connected to the metastructure layer and configured to apply electrostatic force to the metastructure layer.

14. A semiconductor substrate measuring apparatus, comprising:
a transmitter configured to emit an electromagnetic wave;
a light-transmitting dielectric substrate comprising a first surface that is disposed such as to have the electromagnetic wave incident thereon, and a second surface opposite to the first surface;
a metastructure layer comprising a third surface, in contact with the second surface, and a fourth surface opposite to the third surface that is configured to have a semiconductor substrate mounted thereon, and the metastructure layer is divided into a plurality of microstructures by grooves passing through the third surface and the fourth surface, each of the plurality of microstructures having a smaller width than a size of a wavelength of the electromagnetic wave and spaced apart by a distance smaller than the wavelength of the electromagnetic wave; and
a receiver configured to detect the electromagnetic wave after the electromagnetic wave passes through the semiconductor substrate.

15. The semiconductor substrate measuring apparatus of claim 14, wherein the electromagnetic wave is any one from among visible light, infrared light, a millimeter wave, and a terahertz wave (THz wave).

16. The semiconductor substrate measuring apparatus of claim 14, further comprising a frame surrounding an external side surface of the metastructure layer and an external side surface of the light-transmitting dielectric substrate, and the frame comprising an exhaust hole disposed in a region corresponding to the external side surface of the light-transmitting dielectric substrate such as to communicate with the grooves, the exhaust hole configured to receive gas introduced from the grooves such as to provide suction force to the semiconductor substrate.

17. The semiconductor substrate measuring apparatus of claim 14, wherein a surface area of the fourth surface of the metastructure layer is larger than a surface area of the semiconductor substrate that is in contact with the fourth surface.

18. The semiconductor substrate measuring apparatus of claim 14, further comprising a polarizer disposed between the transmitter and the light-transmitting dielectric substrate and configured to phase-convert the electromagnetic wave emitted from the transmitter to a plane wave with respect to the first surface.

19. The semiconductor substrate measuring apparatus of claim 14, wherein the transmitter and the receiver are disposed such as to face each other.

20. The semiconductor substrate measuring apparatus of claim 14, wherein
the light-transmitting dielectric substrate further comprises:
a first light-transmitting dielectric substrate that comprises the second surface; and
a second light-transmitting dielectric substrate that comprises the first surface, and
wherein the first light-transmitting dielectric substrate and the second light-transmitting dielectric substrate are formed of a same material.

\* \* \* \* \*